(12) United States Patent
Yan

(10) Patent No.: US 9,070,744 B2
(45) Date of Patent: Jun. 30, 2015

(54) SHALLOW TRENCH ISOLATION STRUCTURE, MANUFACTURING METHOD THEREOF AND A DEVICE BASED ON THE STRUCTURE

(75) Inventor: Jiang Yan, New York, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 282 days.

(21) Appl. No.: 13/519,573

(22) PCT Filed: Aug. 3, 2011

(86) PCT No.: PCT/CN2011/001281
§ 371 (c)(1),
(2), (4) Date: Jun. 27, 2012

(87) PCT Pub. No.: WO2012/142734
PCT Pub. Date: Oct. 26, 2012

(65) Prior Publication Data
US 2013/0020653 A1  Jan. 24, 2013

(30) Foreign Application Priority Data
Apr. 20, 2011  (CN) ............................ 2011 1 0099133

(51) Int. Cl.
*H01L 21/76* (2006.01)
*H01L 21/762* (2006.01)

(52) U.S. Cl.
CPC ................................ *H01L 21/76232* (2013.01)

(58) Field of Classification Search
CPC ............ H01L 27/7848; H01L 29/66636; H01L 21/823807; H01L 29/165; H01L 21/823814; H01L 29/7833; H01L 29/6659; H01L 21/76232; H01L 21/76229; H01L 21/31053; H01L 21/76224; H01L 21/763; H01L 21/02639; H01L 21/0254; H01L 21/0262; H01L 21/02381; H01L 21/28587; H01L 21/3085; H01L 21/7605; H01L 29/66462; H01L 29/045; H01L 2924/0002; H01L 2924/00; H01L 27/1266; H01L 21/84; H01L 27/13; H01L 2924/3011; H01L 29/7848

USPC .................. 438/424, 427, 435, 481, 429; 257/E21.54, E21.56, E21.09, E21.092, 257/E21.102, E21.132, E21.563
See application file for complete search history.

(56) References Cited

U.S. PATENT DOCUMENTS

| | | | |
|---|---|---|---|
| 4,886,763 A | 12/1989 | Suzuki | 437/61 |
| 5,010,034 A | 4/1991 | Manoliu | 437/89 |

(Continued)

FOREIGN PATENT DOCUMENTS

| | | | |
|---|---|---|---|
| CN | 1681090 A | 10/2005 | H01L 21/00 |
| CN | 1985358 | 6/2007 | H01L 21/20 |

(Continued)

OTHER PUBLICATIONS

Chinese Examination Report, ISR, CPEL1053800N, Jun. 16, 2014.

*Primary Examiner* — Michelle Mandala
(74) *Attorney, Agent, or Firm* — Martine Penilla Group LLP

(57) ABSTRACT

The present invention relates to a shallow trench isolation structure, manufacturing method thereof and a device based on the structure. The present invention provides a method for manufacturing a shallow trench isolation (STI) structure, characterized in comprising the following steps: providing a semiconductor substrate; forming an insulating medium on said semiconductor substrate; etching a part of the insulating medium by using a mask to expose the semiconductor substrate thereunder, the unetched insulating medium forming STI regions; and epitaxially growing a semiconductor layer on said semiconductor substrate between said STI regions as an active region. With the method provided by the present invention, the problem of filling a small-size trench is solved and the problem of STI step height is overcome.

15 Claims, 5 Drawing Sheets

(56) References Cited

U.S. PATENT DOCUMENTS

| | | | |
|---|---|---|---|
| 5,453,396 A | 9/1995 | Gonzalez et al. | 437/69 |
| 6,362,510 B1 | 3/2002 | Gardner et al. | 257/374 |
| 7,186,622 B2 | 3/2007 | Yan et al. | 438/296 |
| 7,786,547 B2 | 8/2010 | Yan et al. | 257/510 |
| 7,985,642 B2 | 7/2011 | Yan et al. | 438/222 |
| 8,173,502 B2 | 5/2012 | Yan et al. | 438/222 |
| 2001/0014504 A1 | 8/2001 | Moon | 438/269 |
| 2005/0104156 A1 | 5/2005 | Wasshuber | 257/510 |
| 2006/0014359 A1 | 1/2006 | Yan et al. | 438/424 |
| 2006/0076639 A1* | 4/2006 | Lypen et al. | 257/471 |
| 2007/0122985 A1 | 5/2007 | Yan et al. | 438/296 |
| 2007/0187799 A1 | 8/2007 | Tanaka et al. | 257/510 |
| 2009/0146262 A1* | 6/2009 | Liu et al. | 257/627 |
| 2009/0227086 A1 | 9/2009 | Hampp et al. | 438/416 |
| 2010/0035394 A1 | 2/2010 | Yan et al. | 438/222 |
| 2011/0237035 A1 | 9/2011 | Yan et al. | 438/197 |

FOREIGN PATENT DOCUMENTS

| | | | |
|---|---|---|---|
| JP | 3-35545 A | 2/1991 | |
| JP | 3035545 A | 2/1991 | H01L 21/76 |
| JP | 2002057331 A | 2/2002 | H01L 21/336 |
| JP | 2005327867 | 11/2005 | H01L 21/76 |
| JP | 2005327867 A | 11/2005 | H01L 21/76 |
| KR | 10-2010-0076257 A | 7/2010 | H01L 27/146 |

* cited by examiner

US 9,070,744 B2

1

SHALLOW TRENCH ISOLATION STRUCTURE, MANUFACTURING METHOD THEREOF AND A DEVICE BASED ON THE STRUCTURE

CLAIM OF PRIORITY

This application is a Section 371 National Stage Application of International Application No. PCT/CN2011/001281, filed on Aug. 3, 2011, which claims priority to Chinese Application No. CN201110099133.5, filed on Apr. 20, 2011 entitled "Shallow Trench Isolation Structure, Manufacturing Method Thereof and a Device Based on the Structure", the entire contents of which are incorporated herein by reference in their entirety.

FIELD OF THE INVENTION

The present invention relates to the semiconductor manufacture field, and particularly to a shallow trench isolation structure, a manufacturing method thereof and a device based on the structure.

BACKGROUND OF THE INVENTION

With the fast development of semiconductor manufacturing technology, integrated circuit manufacturing process has entered technology node of 22 nm or blow, the size of a semiconductor device and isolation structure for such semiconductor device has been reduced accordingly. After the 0.25 μm technology node, the isolation region between elements in an active region of a semiconductor device is typically formed by a shallow trench isolation (STI) process.

In the prior art, the process of forming a STI structure typically comprises the following steps:

First, as shown in FIG. 1a, forming a passivation layer 102 such as a silicon oxide plus silicon nitride composite layer on a surface of a substrate 100 and a patterned photoresist layer 104.

Then, as shown in FIG. 1b, etching said passivation layer 102 by using the illustrated photoresist layer 104 as a mask to expose the substrate 100, and removing the photoresist layer.

After that, as shown in FIG. 1c, etching the exposed substrate to form a trench 106 by using the etched passivation layer 102 as a hard mask.

Thereafter, as shown in FIG. 1d, forming a lining oxide layer 108 at the sidewalls and bottom of a trench 90, then filling an insulating medium 110, such as silicon oxide, in the shallow trench, and planarizing the surface of the trench by a Chemical Mechanical Polishing (CMP) process.

After performing CMP, the hard mask is also removed, as shown in FIG. 1e.

Then, when the feature size of a device is reduced to below 22 nm node, filling of STI will be a big problem, and the process tolerance of STI filling will also become narrower. It is still the same even if the most general high density plasma deposition (HDP) process and the more advanced high aspect ratio plasma deposition (HARP) process are used.

Besides, since the hard mask will be partly consumed in the processing of forming a trench, and the surface of the rest of the hard mask becomes rough, causing the height of the surface thereof becomes uneven. Particularly, the unevenness of the surface of the hard mask becomes even more obvious with the reducing of the feature size. From FIG. 1e it can be seen that a step height H, which is usually about 30 nm-50 nm, will be formed between the substrate region and the region filled with an insulating medium in the trench after the hard mask is removed. Unevenness of height of the hard mask surface will result in unevenness of step height in the same wafer surface. In the subsequent process steps, a gate dielectric layer and a polysilicon layer or a metal layer (for the current high-K metal gate structure) are formed on the surface of the active regions on the both sides of a trench. Since there is a step height in the formation of a STI structure, the profile of the polysilicon will become uneven, and there will be polysilicon residues when the polysilicon is etched thereafter. These polysilicon residues will cause a short circuit or leakage current path that harms the STI isolation function, which causes degradation of performance of the integrated circuit, resulting in reliability problem and device failure.

Therefore, a new STI isolation structure and a manufacturing method thereof is desired, by which the problem of filling a small-size trench without causing step height could be solved.

Besides, with the reducing of the size of an isolation structure, the isolation effect between devices is getting worse. Although in the case of the same transverse pitch P (the transverse width of an active region plus an isolation region) as shown in FIG. 1e, the isolation effect can be enhanced by increasing the transverse width D of the STI region, obviously, this will definitely reduce the effective area usable for the active region 114 of the device, resulting in deterioration of the device characteristics.

Therefore, a new STI isolation structure and a manufacturing method thereof are further desired, by which good characteristics of the device are kept while a good isolation effect is maintained.

SUMMARY OF THE INVENTION

In order to solve the beforesaid problems, according to a first aspect of the present invention, there is provided a method for manufacturing a shallow trench isolation (STI) structure, characterized in comprising the following steps: providing a semiconductor substrate; forming an insulating medium on said semiconductor substrate; etching a part of the insulating medium by using a mask to expose the semiconductor substrate thereunder, the unetched insulating medium forming STI regions; and epitaxially growing a semiconductor layer on said semiconductor substrate between said STI regions as an active region.

According to a second aspect of the present invention, there is provided a shallow trench isolation (STI) structure, characterized in comprising: a semiconductor substrate; a patterned insulating medium formed on the semiconductor substrate as a STI region; and a semiconductor layer formed on the semiconductor substrate between STI regions as an active region, wherein the material of said semiconductor layer is identical with that of said semiconductor substrate.

According to a third aspect of the present invention, there is provided a CMOS device, characterized in comprising the shallow trench isolation structure as stated in the first aspect of the present invention, wherein a PMOS transistor and a NMOS transistor are formed in the two adjacent active regions, respectively.

According to a fourth aspect of the present invention, there is provided a Dynamic Random Access Memory (DRAM) or a Flash comprising the CMOS device as stated in the third aspect of the present invention.

In summary, the present invention accomplishes manufacturing of a STI structure by the process of first etching and then epitaxially growing, whereby the problem of filling a small-size trench is solved and the problem of STI step height is overcome. Moreover, the shape of a STI can be adjusted through an etching process, whereby a STI structure which can achieve a good isolation effect and to increase the effective area of an active region of a device is obtained, and performance of the device is thus enhanced.

BRIEF DESCRIPTION OF THE DRAWINGS

Embodiments of the present invention can be best understood with reference to the following descriptions and drawings showing each of the embodiments.

DETAILED DESCRIPTION OF THE PREFERRED EMBODIMENTS

One or more aspects of the embodiment of the present invention are described below with reference to the drawings, wherein generally the same element is denoted by the same reference sign throughout the drawings. In the following description, in order for illustration, many specifics are discussed in order to provide thorough understanding of one or more aspects of the embodiment of the present invention. However, it is obvious for those skilled in the art that one or more aspects of the embodiment of the invention can be implemented by making use of few of said specifics.

In addition, although particular features or aspects of the embodiment are disclosed by only one of the implementing modes, yet such features or aspects may be incorporated with other features or aspects of other implementing modes which may be desired and advantageous for any given or particular application.

Figure 2:
FIGS. 2-5, 6a-6d and 7 are cross-sectional views of a STI structure obtained by using a method for manufacturing a STI structure according to the present invention.

First, a semiconductor substrate 200 as shown in FIG. 2 is provided. Said semiconductor substrate can be any known type in the electronics field, such as a bulk semiconductor and a semiconductor on an insulating layer (SOI) and can be formed of the material such as monocrystalline silicon, gallium arsenide or indium phosphide. In one embodiment, the semiconductor substrate 200 is a silicon substrate of (100) orientation or (110) orientation. Selection of the orientation is dependent on requirement on performance of a finished device. The substrate of (100) orientation is advantageous for increasing electron mobility of electrons in a device; while the substrate of (110) orientation is advantageous for increasing mobility of holes in a device, and due to their inherent property, mobility of electrons is greater than mobility of holes. Thus, in a CMOS device, for instance, if it is desired that the performance of a PMOS device and the performance of a NMOS device therein are as close as possible, the substrate of (110) orientation is preferred; if a higher performance of the NMOS device is desired, then the substrate of (100) orientation is preferred. Moreover, the provided semiconductor substrate may be a P-type, an N-type or an undoped substrate.

Figure 3:
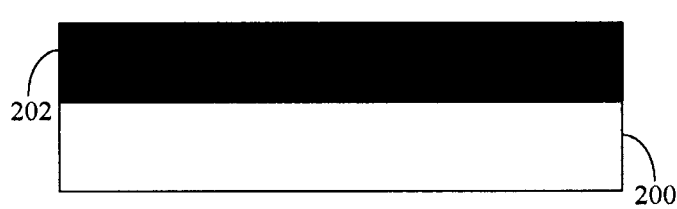

Then, an insulating medium 202 is formed on the semiconductor substrate 200, as shown in FIG. 3. The insulating medium 202 may have a thickness equal to the height of a predetermined STI. In one embodiment, said insulating medium is an oxide (e.g. $SiO_2$) or nitride (e.g. SIN, $Si_3N_4$). The insulating medium 202 may be formed by, for example, a deposition process. The present invention does not have any limitation to the process for depositing the insulating medium, which includes but is not limited to Chemical Vapor Deposition (CVD), plasma-assisted CVD, Atomic Layer Deposition (ALD), evaporation, reactive sputtering, chemical solution deposition or other similar deposition processes. As an alternative, said insulating medium 202 can also be formed by a combination of a thermal oxidation process and a deposition process, namely, thermal oxidizing the semiconductor substrate 200 first to form a thin oxide film (forming a thin layer of $SiO_2$ in the case of a silicon substrate), then depositing the rest of the $SiO_2$ by a deposition process to reach a predetermined height.

Figure 4:
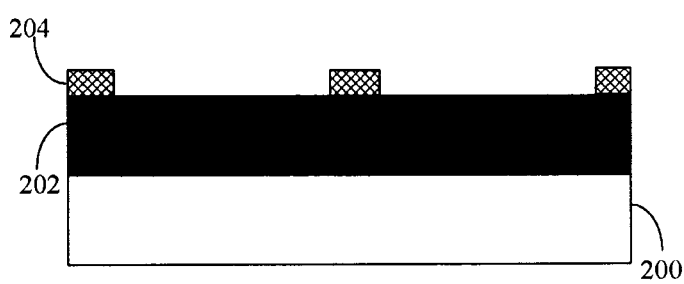

Then, a photoresist layer 204 is coated on the insulating medium 202, and patterned through lithography technology such as exposure and development to expose a part of the insulating medium, as shown in FIG. 4.

Figure 5:
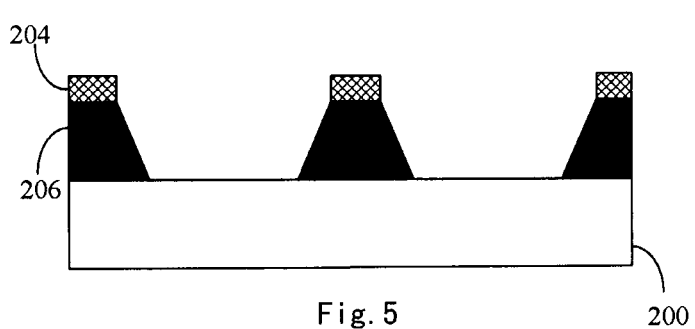

Thereafter, the exposed part of insulating medium is removed to expose the semiconductor substrate 200 thereunder by either a dry etching process, such as reactive ion etching (RIE) or plasma etching, or a wet etching process or the combination thereof, then the photoresist layer is removed, whereby a structure as shown in FIG. 5 is obtained, and the unremoved part of insulating medium serves as a STI region 206.

After cleaning the wafer, a semiconductor layer is epitaxially grown on said semiconductor substrate 200 between STI regions as an active region 208 of the device. The epitaxial growth is performed by, for example, metal-organic chemical vapor deposition (MOCVD) or molecular beam epitaxy (MBE). Except that the crystallization direction of the epitaxial layer is the same as that of the substrate, other characteristics, such as material, conduction type and resistivity of the layer can be selected freely. Preferably, the material of said semiconductor layer may be identical with the material of said semiconductor substrate 200. In the embodiment where the semiconductor substrate is formed of silicon, said semiconductor layer is preferably formed of silicon.

Figure 6A:
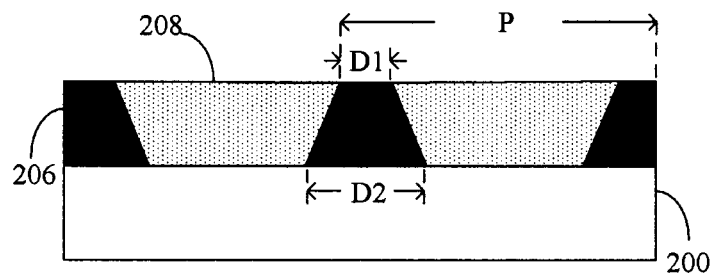

After that, planarization is performed by a CMP process, the redundant epitaxial semiconductor layer is removed to obtain the final structure, as shown in FIG. 6a.

It should be noted herein that, in the prior art, etching is performed to a semiconductor layer, the unetched semiconductor layer serves as an active region, and the region where the semiconductor part has been etched can form a STI region by means of a process of filling a medium. The technical solution of the present invention is completely different from the prior art: the present invention forms a shallow isolation region naturally by etching an insulating layer on a semiconductor substrate, and forms an active region by epitaxially growing a semiconductor material at the position where the insulating layer is etched, thus, a STI filling process is not needed. Besides, since the present invention does not use a hard mask, there isn't the problem of influence on the device performance due to the step height caused by removing the hard mask. A transverse width D1 (as shown in FIG. 6a) of the top of the STI region 206 in the present invention can be smaller than a transverse width D (as shown in FIG. 1e) of a top surface of a STI region in the prior art, thus a transverse width of an active region of a device is increased in the case of the same pitch P, whereby IC density is enhanced.

It should be pointed out that if it is only for solving the problem of filling a small-size trench and overcoming the defect of STI step height, the present invention does not have any limitation to the shape of a STI region, for example, the STI region may be formed into a substantially vertical rectangular structure viewed from its cross-section (as shown in FIG. 6a) etc. by a selective etching process. However, for further enhancing the isolation effect between devices, a shape of a narrow top and a wide bottom (D2>D1) viewed from its cross-section (as shown in FIGS. 6a-6d) is preferably formed in the step of etching the insulating layer.

Figure 1A:
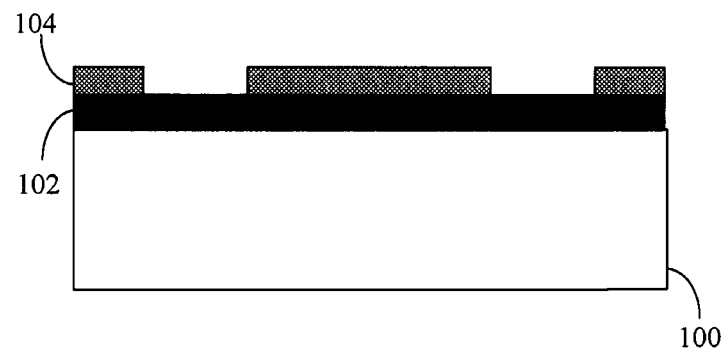
FIGS. 1a-1e are cross-sectional views of a STI structure obtained by using a method for manufacturing a STI structure according to the prior art.
Figure 1B:
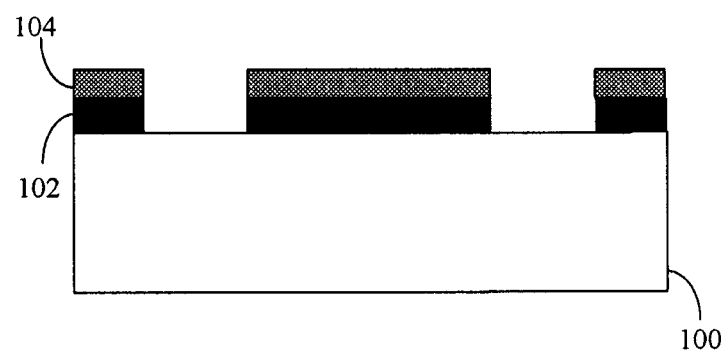
Figure 1C:
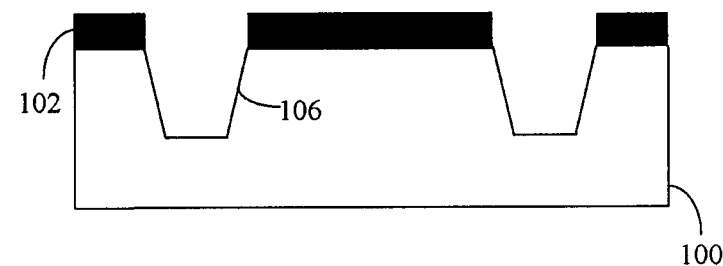
Figure 1D:
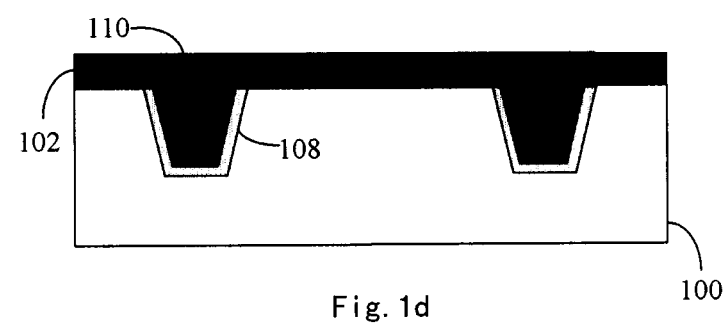
Figure 1E:
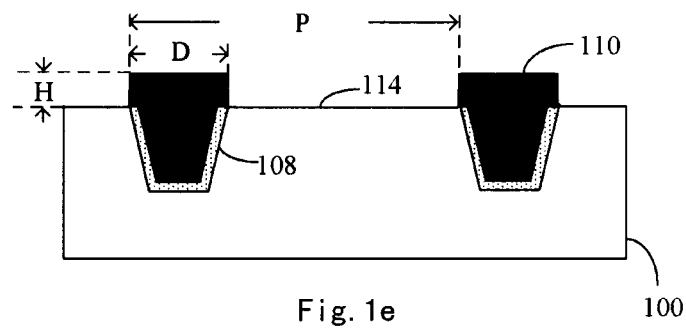

In FIG. 6a, the isolation region is of a regular trapezoid shape, a transverse width D1 of its top surface may be smaller than a transverse width D of the isolation region in FIG. 1e, a transverse width of its bottom surface is D2, which is greater than D1. This is advantageous for increasing a transverse width of an isolation region on the whole, whereby the isolation effect can be enhanced, and the space for manufacturing a channel region and a source/drain in an upper area of an active region of a device and for manufacturing a gate structure over the active region is saved. An isolation region of a regular trapezoid shape is obtained naturally by etching the insulating medium into an inverted trapezoid shape. An inverted trapezoid shape with a wide top and a narrow bottom can be easily achieved either using a wet etching or a dry etching, e.g. using a dry etching or a wet etching with a longitudinal etching rate substantially equal to a lateral etching rate. This does not impose any extra requirement on the etching process.

Figure 6B:
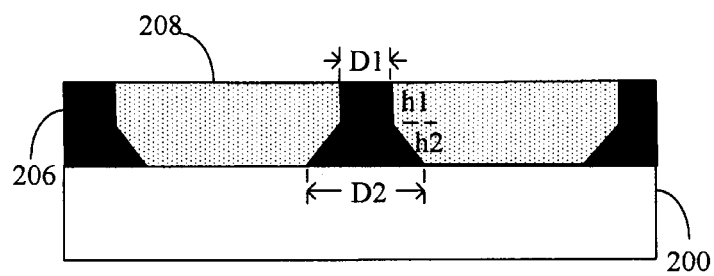
Figure 6C:
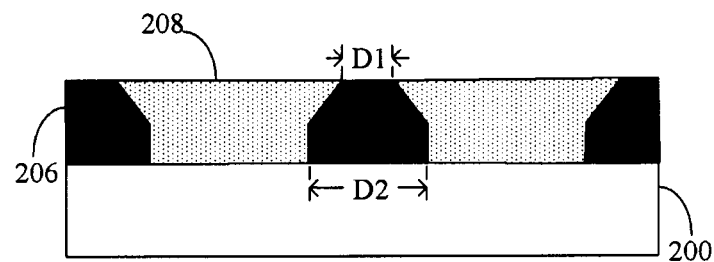
Figure 6D:
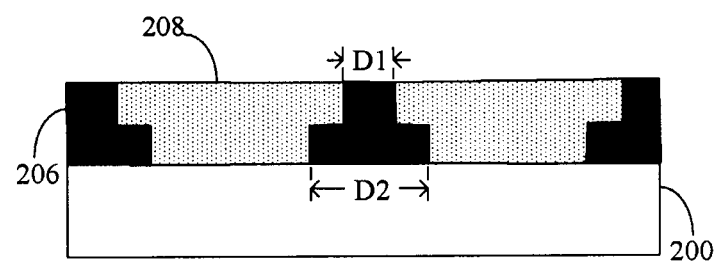

Similarly, various STI structures as shown in FIGS. 6(b), 6(c), and 6(d) may be also formed. In FIG. 6(b), a combined shape of a rectangular upper structure and a regular trapezoidal lower structure is formed. Said shape can be realized through, for example, performing an anisotropic dry etching with a longitudinal etching rate greater than a lateral etching rate first to form a substantially vertical shape, then performing an isotropic dry etching or a wet etching with a longitudinal etching rate substantially equal to a lateral etching rate. In FIG. 6(c), contrary to FIG. 6(b), a combined shape of a regular trapezoidal upper structure and a rectangular lower structure is formed. Said shape can be realized through, for example, performing a dry etching or a wet etching with a longitudinal etching rate substantially equal to a lateral etching rate first, then performing a dry etching with a longitudinal etching rate greater than a lateral etching rate. In FIG. 6(d), a combined shape of two substantially vertical rectangular shapes is formed. Said shape can be realized through, for example, first performing a dry etching having a first lateral etching rate and a longitudinal etching rate greater than the first lateral etching rate, then performing a dry etching having a second lateral etching rate greater than the first lateral etching rate and a longitudinal etching rate greater than the second lateral etching rate. In a reactive ion etching (RIE) or plasma etching, an anisotropic etching rate ratio can be realized by methods of adjusting the component proportion of the reacting gases and radio frequency power and so on.

In the structures as shown in FIGS. 6(a)-6(d), transverse widths D1 and D2 of said isolation regions and a height ratio (h1:h2) of the upper structure and the lower structure can be changed through changing the etching process parameters (if it is a combination of two shapes, see FIGS. 6(a)-6(c)). What kind of D1, D2 and height ratio are desired is determined by considering an effective area of an active region and the isolation effect required by the device. For example, if requirement on isolation performance of a device is not high and a larger effective area of the active region is desired, D1 can be reduced suitably or the height ratio (h1:h2) can be increased, and vice versa.

Under the teaching of the present invention, those skilled in the art can easily conceive of obtaining various shapes of a STI region which can both increase a transverse width of an active region and keep good isolation effect by changing the etching process.

Figure 7:
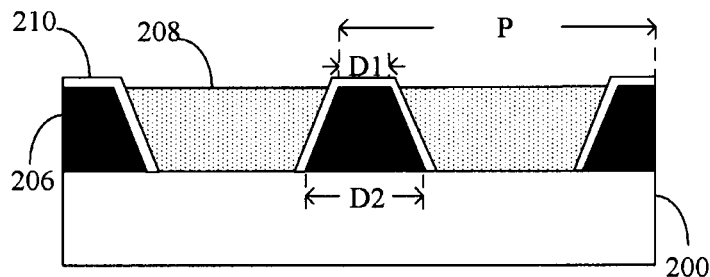

Preferably, a lining oxide layer 210 can be formed on a top surface and sidewalls of said shallow trench isolation region prior to the step of epitaxial growth, as shown in FIG. 7, which is formed on the basis of the structure as shown in FIG. 6a. Obviously, the lining oxide layer may also be applied to the structures as shown in FIGS. 6b, 6c and 6d. Said lining oxide layer is helpful for restoring defects generated by the etching. In one embodiment, said lining oxide layer is formed of an oxide, a nitride or a combination thereof by a thermal oxidation process. The lining oxide layer comprises laminated layers of one of silicon dioxide/silicon nitride, silicon dioxide/silicon oxynitride, silicon oxynitride/silicon nitride and silicon dioxide/silicon nitride/silicon oxynitride. According to another embodiment of the present invention, the oxide, the nitride or the combination thereof may be formed by one of a low pressure chemical vapor deposition (LPCVD) process, a plasma enhanced chemical vapor deposition (PECVD) process and an atomic layer chemical vapor deposition (ALCVD) process or the combination thereof. The lining oxide layer comprises laminated layers of one of silicon dioxide/silicon nitride, silicon dioxide/silicon oxynitride, silicon oxynitride/silicon nitride and silicon dioxide/silicon nitride/silicon oxynitride. Thereafter, the lining oxide layer (if any) on the surface of the semiconductor substrate in the active region of the device is removed.

Figure 8:
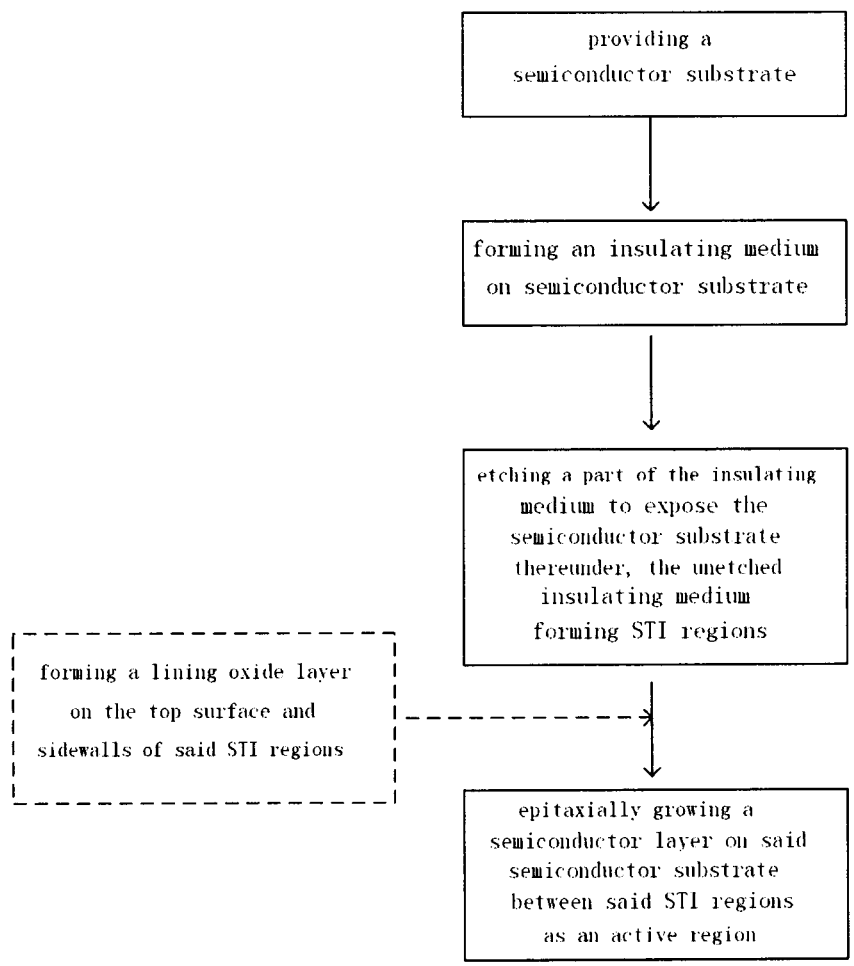
FIG. 8 is a flow chart of manufacturing a STI structure according to the present invention.

FIG. 8 shows a flow chart of manufacturing a STI structure of the present invention, wherein the dash-line box indicates an optional step.

Figure 9:
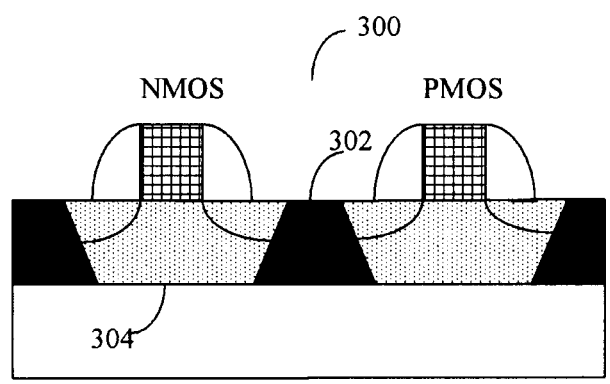
FIG. 9 is a cross-sectional view of a CMOS device formed on the basis of the structure obtained according to the present invention.

A further embodiment of the present invention comprises a CMOS device 300 manufactured on said formed structure, wherein the aforesaid STI region is used as an isolation region 302 of the CMOS device, and a PMOS transistor and a NMOS transistor are formed in two adjacent active regions 304, respectively, as shown in FIG. 9. Said CMOS device may either be a traditional CMOS device of a gate dielectric/gate conductor formed by, e.g., $SiO_2$/polysilicon, or a CMOS device of a gate dielectric/gate conductor formed by a high K dielectric/metal. Furthermore, the STI structure and technology of the present invention may also be applied to an apparatus and a circuit comprising said CMOS device, such as a dynamic random access memory (DRAM) and Flash etc.

In summary, with the manufacturing method of the present invention, a STI structure may be manufactured without performing STI filling, thus, there isn't the problem in device performance caused by the step height in the prior art. Besides, the shape of a STI can be adjusted through an etching process, whereby a STI structure which can achieve a good isolation effect and increase an effective area of an active region of a device is obtained.

The above is only a preferred embodiment of the present invention, which does not intend to make any limitation to the invention. Therefore, various modifications and variations may be made to the invention without departing from the principle of the technical method of the present invention and the scope defined by the attached claims.

What is claimed is:

1. A method for manufacturing a shallow trench isolation (STI) structure, characterized in comprising the steps of:
   providing a semiconductor substrate;
   forming an insulating medium on said semiconductor substrate;
   etching a part of the insulating medium by using a mask to expose the semiconductor substrate thereunder, the unetched insulating medium forming STI regions;

epitaxially growing a semiconductor layer on said semiconductor substrate between said STI regions as an active region; and wherein the STI region has a shape of a combined shape with a rectangular upper structure and a regular trapezoidal lower structure, wherein a transverse width of said rectangular is D1, a transverse width of the top surface of said regular trapezoid is D1, and a transverse width of the bottom surface is D2, where D2>D1.

2. The method for manufacturing a STI structure according to claim 1, further comprising: forming a lining oxide layer on a top surface and sidewalls of said STI region prior to said step of epitaxial growth.

3. The method for manufacturing a STI structure according to claim 2, wherein said lining oxide layer is formed by a thermal oxidation process or a deposition process.

4. The method for manufacturing a STI structure according to claim 1, wherein said semiconductor substrate is a silicon substrate of (100) orientation or (110) orientation.

5. The method for manufacturing a STI structure according to claim 1, wherein the material of said epitaxially grown semiconductor layer is identical with the material of said semiconductor substrate.

6. The method for manufacturing a STI structure according to claim 1, wherein transverse widths D1 and D2 of said isolation region or a height ratio of the upper structure and lower structure are changed through changing the etching process parameters.

7. The method for manufacturing a STI structure according to claim 6, wherein changing the etching process parameter comprises changing component proportion of reacting gases and radio frequency power.

8. A shallow trench isolation (STI) structure, characterized in comprising:

a semiconductor substrate;

a patterned insulating medium formed on said semiconductor substrate as a STI region;

a semiconductor layer formed on the semiconductor substrate between STI regions as an active region, wherein the material of said semiconductor layer is identical with the material of said semiconductor substrate; and wherein the STI region has a shape of a combined shape with a rectangular upper structure and a regular trapezoidal lower structure, wherein a transverse width of said rectangular is D1, a transverse width of the top surface of said regular trapezoid is D1, and a transverse width of the bottom surface is D2, where D2>D1.

9. The STI structure according to claim 8, characterized in further comprising a lining oxide layer formed on a top surface and sidewalls of said STI region.

10. The STI structure according to claim 9, characterized in that said lining oxide layer is formed of a material of an oxide, a nitride or combination thereof.

11. The STI structure according to claim 8, wherein said semiconductor substrate is a silicon substrate of (100) orientation or (110) orientation.

12. A CMOS device, characterized in comprising the shallow trench isolation structure according to claim 8, wherein a PMOS transistor and a NMOS transistor are formed in two adjacent active regions, respectively.

13. A Dynamic Random Access Memory (DRAM) or a Flash comprising the CMOS device according to claim 12.

14. A CMOS device, characterized in comprising the shallow trench isolation structure according to claim 8, wherein a PMOS transistor and a NMOS transistor are formed in two adjacent active regions, respectively.

15. A CMOS device, characterized in comprising the shallow trench isolation structure according to claim 1, wherein a PMOS transistor and a NMOS transistor are formed in two adjacent active regions, respectively.

* * * * *